United States Patent [19]

Zovko et al.

[11] Patent Number: 4,552,300

[45] Date of Patent: Nov. 12, 1985

[54] METHOD AND APPARATUS FOR SOLDERING AND DESOLDERING LEADLESS SEMICONDUCTOR MODULES FOR PRINTED WIRING BOARDS

[75] Inventors: Carl B. Zovko, Melbourne, Fla.; Alan D. Vogel, Columbia, Md.

[73] Assignee: Pace, Incorporated, Laurel, Md.

[21] Appl. No.: 492,989

[22] Filed: May 9, 1983

[51] Int. Cl.[4] .............................................. B23K 1/12
[52] U.S. Cl. ................................... 228/20; 219/85 R; 219/373; 228/264; 228/242
[58] Field of Search ................ 228/20, 6 A, 264, 119, 228/242; 219/373–375, 368, 85 R

[56] References Cited

U.S. PATENT DOCUMENTS

| | | | |
|---|---|---|---|
| 3,230,338 | 1/1966 | Kawecki | 219/85 |
| 3,382,564 | 5/1968 | Gallentine | 228/6.2 X |
| 3,522,407 | 8/1970 | Costello | 219/85 BA X |
| 3,604,108 | 9/1971 | Mallery | 228/6.2 X |
| 3,632,973 | 1/1972 | O'Keefe | 228/51 X |
| 3,746,239 | 7/1973 | Auray | 228/20 X |
| 3,766,623 | 10/1973 | Lerner et al. | 29/764 |
| 3,838,240 | 9/1974 | Schelhorn | 219/373 X |
| 3,842,478 | 10/1974 | Schreckeneder | 29/764 |
| 3,990,863 | 11/1976 | Palmer | 228/264 X |
| 4,066,204 | 1/1978 | Wirbser et al. | 228/6.2 X |
| 4,136,444 | 1/1979 | Durney | 228/264 X |
| 4,205,221 | 5/1980 | Meyer | 219/373 X |
| 4,295,596 | 10/1981 | Doten et al. | 228/242 |

Primary Examiner—Kenneth J. Ramsey
Attorney, Agent, or Firm—Murray, Whisenhunt & Ferguson

[57] ABSTRACT

A method and apparatus is disclosed for soldering leadless semiconductor modules having contact pads on the bottom thereof to and desoldering them from leaded terminal pads on a printed wiring board. The device includes a housing having a bore in which is slidably mounted a suction head. The suction head is used to raise and lower the module relative to the leaded terminals. The suction head has a passageway connected to a source of vacuum for both holding the module relative to the head as well as exhausting heated air from a source which is directed against the leaded terminals to melt same.

9 Claims, 11 Drawing Figures

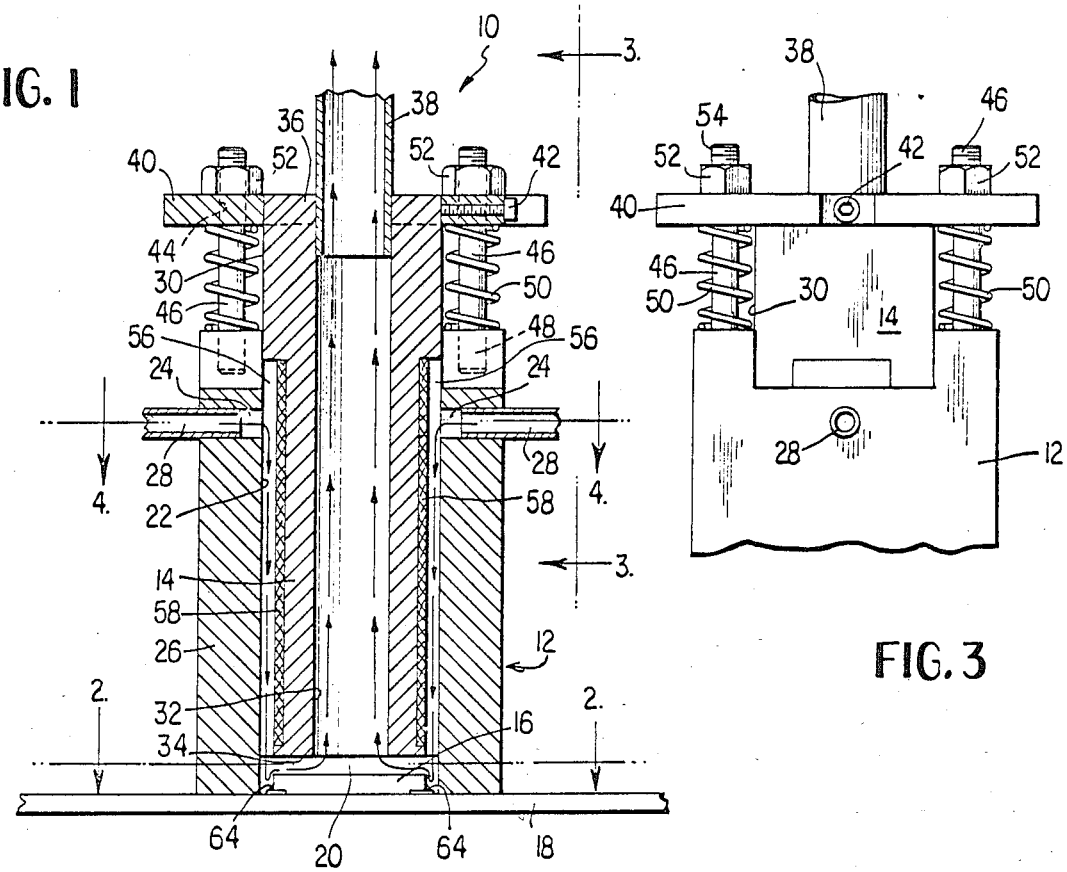
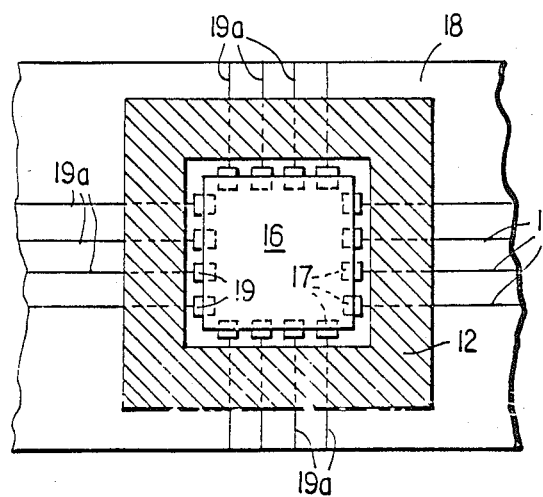

METHOD AND APPARATUS FOR SOLDERING AND DESOLDERING LEADLESS SEMICONDUCTOR MODULES FOR PRINTED WIRING BOARDS

BACKGROUND OF THE INVENTION

1. Field of the Invention

The invention relates to a method and portable apparatus for soldering leadless semiconductor modules to or desoldering them from leaded terminal pads on a printed wiring board.

2. Description of the Prior Art and Objects

The development of leadless semiconductor modules or chip carriers, as they are often referred to has necessitated new techniques for attaching them to or removing them from printed wiring or circuit boards both during initial assembly of a plurality of carriers on a board or for the purpose of repair when only a single carrier need be removed and replaced.

The problem arises from the fact that the new carriers are leadless in that they have only contact pads on the bottom side of the carrier which must mount to tin-lead pads on the printed wiring board in contrast to earlier carriers that had depending metal legs which were inserted into and soldered to plated through-holes in the printed wiring board. The application of heat required to melt the solder during removal and replacement must be done in a way so as not to damage either the replacement carrier itself, carriers mounted adjacent thereto or damage the pads on the printed wiring board.

Known devices use either heated air or a tool having an electrically heated appendage(s) to melt the solder on the board pad to effect removal or attachment of the carrier pads thereto. Those devices that use heated air have the drawback that the air is often uncontrollably hot and directed at the whole carrier instead of only the pad portions resulting in damage to the replacement carrier as well as to neighboring carriers and the printed wiring board itself. Those devices that consist of a tool having a heated appendage which fits around the perimeter of the carrier have the drawback that it is not usually possible to determine when the solder between each pad has melted which results in pads being pulled off and burning of the printed wiring board. Further, the heated appendages may conduct electrical energy to the carrier in the form of an electrostatic discharge thus damaging it internally.

It is therefore the primary object of the present invention to provide a superior method and apparatus for effectively removing and replacing leadless semiconductor modules or chip carriers.

It is another object of the invention to provide a device capable of transmitting heat directly to the working area of one carrier to prevent damage to surrounding carriers caused by large temperature rises.

It is a further object of the present invention to provide a device and lift-off method which is not destructive to the carrier and which protects the printed wiring board from damage.

It is a still further object of the invention to provide a device of the subject type which is compact, easily manipulated and which is relatively inexpensive to manufacture, use and maintain.

Other objects and advantages of the present invention will become apparent and obvious from a study of the following description and accompanying drawing which are merely illustrative of the present invention:

BRIEF DESCRIPTION OF THE DRAWINGS

FIG. 1 is an elevational view in cross-section of the soldering-desoldering device of the present invention;

FIG. 2 is a cross-sectional view of the device of FIG. 1 taken along the lines 2—2 thereof;

FIG. 3 is a partial side elevation view of the device of FIG. 1 taken along the lines 3—3 thereof;

FIG. 4 is a cross-sectional view taken along the lines 4—4 of FIG. 1;

DESCRIPTION OF PREFERRED EMBODIMENTS

Figure 5:
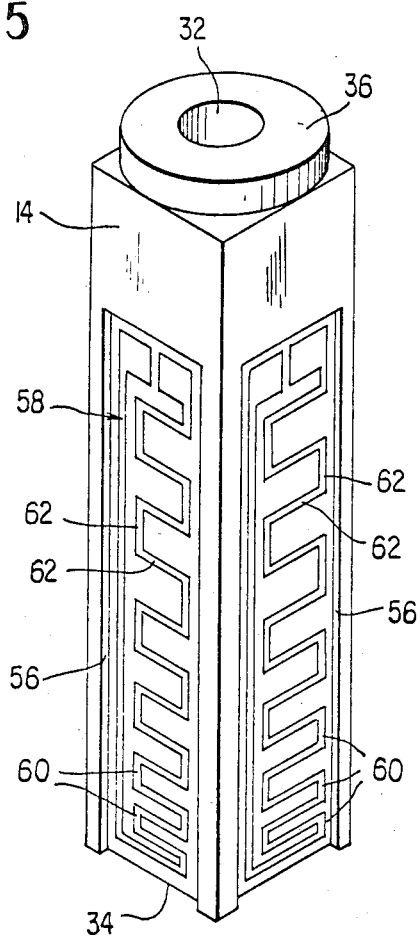
FIG. 5 is a perspective view of the heater assembly of the device of the present invention.

Referring now to the drawings and particularly to FIGS. 1–5, there is illustrated generally at 10 the soldering-desoldering device of the present invention. The device 10 comprises broadly a housing member 12 and a heater assembly 14 slidable in the housing member shown positioned over a leadless semiconductor module or chip carrier 16 mounted on a printed wiring board 18. The chip carrier 16 typically has a plurality of spaced apart metal contact pads 17 adjacent the periphery thereof. When the chip carrier 16 is in position on the printed wiring board 18, the pads 17 are above corresponding tin-lead pads 19 on the wiring board which in turn are connected by leads 19a to other circuitry in a well-known manner.

The housing member 12 is preferably made out of ceramic material well-known for its insulative properties and has a longitudinally extending, open ended, bore 20. The bore 20 has a wall 22 with a configuration that is substantially that of the perimeter of the chip carrier 16 only larger. The housing member also has a plurality of passageways 24 which extend between the outer wall 26 and the wall 22 of the bore 20 to permit air under pressure from a source (not shown) to be introduced thereto through a pipe 28 for purposes that will be more fully discussed later.

The heater assembly 14 also made of ceramic material has an outer configuration defined by surface 30 to be substantially that of the housing wall 22. The heater assembly 14 has a longitudinally extending passageway 32 leading from an opening onto the face 34 thereof to the end 36. The passageway 32 is connected to a source of vacuum (not shown) by means of a pipe 38. The heater assembly 14 is slidably mounted within the bore 20 by means of a connector plate 40 secured thereto at end 36 by means of a set screw 42. The connector plate 40 in turn has a plurality of holes 44 adjacent the periphery thereof which are positioned on studs 46 threaded at one end 48 for securing them in housing member 12. Compression springs 50 are positioned over the studs 46 between the connector plate 40 and housing member 12 to bias the heater assembly 14 and the face 34 thereof a distance spaced from the chip carrier 16 when at rest. This distance is controlled by means of nuts 52 which are threaded onto the other ends 54 of studs 46.

The heater assembly 14, in the embodiment shown, has a longitudinally extending rectangular shaped channel 56 formed in each side of outer surface 30. A heater element 58 of etched nichrome is cemented into each of the channels 56 and electrically connected in series with each other and a controllable source of electric current (not shown). As will be noted, the traversing heater segments 60 are closer together at the end of the heater assembly 14 adjacent the face 34 to radiate a greater amount of more concentrated heat than are the traversing heater segments 62 adjacent end 36 for the purpose to be hereinafter described with respect to the operation of the device.

Figure 6A:
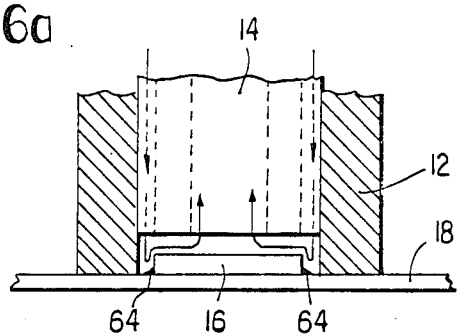
FIGS. 6A, 6B and 6C are pictorial illustrations of the method steps employed in removing a leadless chip carrier from a printed wiring board.
Figure 6B:
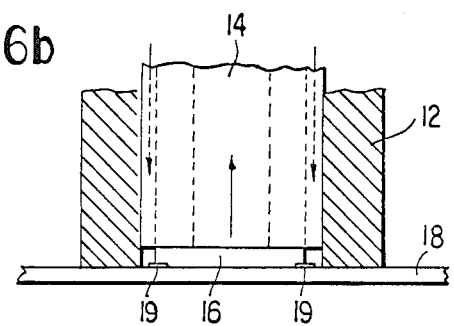
Figure 6C:
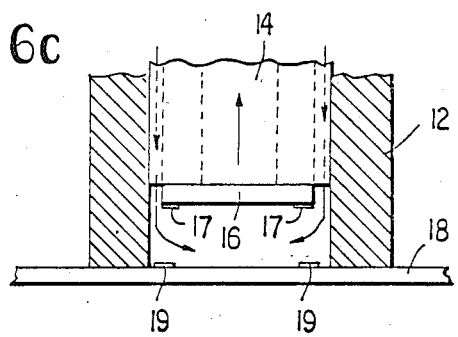

Referring now to FIGS. 6a-6C, when it is desired to remove a chip carrier 16 from a printed wiring board 18, the housing member 12 is positioned over the chip carrier 16 as shown in FIG. 6a wherein the passageway 24 surrounds the chip carrier 16. Air under pressure (see arrows) from a source (not shown) is introduced into bore 20 between wall 22 and channel 56 of heater assembly 14 via pipes 28. The air is heated on its downward travel over heater elements 58. Because of the closeness of the traversing heater segments 60 as aforementioned, the watts density is greater at the bottom than it is at the top thus the temperature at the bottom is greater there than at the top. The purpose of this design is so that the incoming air flow at the top is preheated before it is subjected to the gradual temperature rise of the remaining length of the heater elements 58. This assures a gradual, uniform temperature rise and eliminates the possibility of subjecting the heater assembly 14 to thermal shock.

At the same time that the air enters the bore 20 and is heated as aforementioned, vacuum (see arrows) is being applied at passageway 32 via pipe 38 from a source of vacuum (not shown). The heated air flows around the sides of the chip carrier 16 and causes melting of the solder 64. The still warm air is then removed through passageway 32 by the presence of the vacuum thus eliminating the possibility of building up pressure inside the bore 20 and forcing the heated air out through the bottom of the housing member 12 adjacent the printed wiring board 18 causing possible damage to the board and damage to adjacent chip carriers located thereon. Thus, the unique combination of incoming air under pressure and the exhaust vacuum insures that the heated air travels directly to the soldered area 64 on each side of the chip carrier 16 where it melts the solder and is then exhausted away so that it causes no damage to the printed wiring board 18 or adjacent chip carriers. Also by so controlling the air flow and vacuum, there is assurance that a temperature rise occurs only at the soldered area 64 of the chip carrier 16 and the thickness of the substrate or addition of heat sinks to the bottom of the substrate has little effect on the time it takes to reach the solder melt temperature of the chip carrier connection. This feature enhances the device's ability to handle a wide variety of substrate types and thicknesses without having to make any modifications to the device's duty cycle.

After the heated air has reached a certain temperature and the solder melted, the heater assembly 14 is pushed down in bore 20 so that the end 34 sits on top of the chip carrier 16 as shown in FIG. 6B. At this time an additional amount of vacuum may be applied in passageway 32 to hold the chip carrier 16 thereto as it is gently lifted off of the printed wiring board 18 as the heater assembly 14 is returned to its at rest position by springs 50 as shown in FIG. 6C. This method of chip carrier removal is superior to any mechanical gripping device because the vacuum applies just enough force to lift the chip carrier and break the surface tension between the carrier and the molten solder. If for some reason the solder is not completely molten and the carrier is still attached to the printed wiring board, the applied vacuum force is not sufficient to lift the carrier and will leave it in its place. This eliminates the possibility of pulling up a printed wiring board pad with the carrier which could be done very easily with a mechanical gripping device.

Figure 7A:
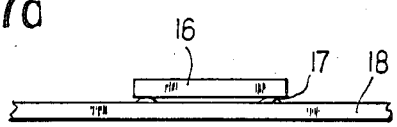
FIGS. 7A, 7B and 7C are pictorial illustrations of the method steps employed in installing a leadless chip carrier on a printed wiring board.
Figure 7B:
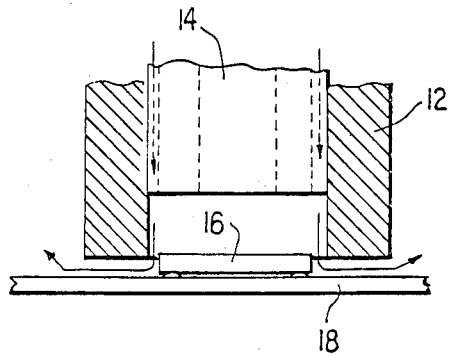
Figure 7C:
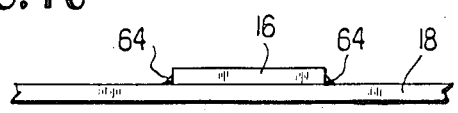

The procedure for installing a leadless chip carrier on a printed wiring board is similar to that aforedescribed with regard to its removal. Referring to FIGS. 7A-7C, the pads 17 of a chip carrier 16 are placed on the presoldered pads 19 on the printed wiring board 18. The air flowing into the housing member 12 is allowed to be heated by heater assembly 14 for a period of time sufficient to raise the temperature of the air enough to melt solder. The housing member 12 is then placed over the chip carrier 16 as shown in FIG. 7B such that the end of the housing member 12 does not set on the top of the printed wiring board 18. The heated air is then directed to the solder 64 until it melts thus securing the pads 17, 19 together as shown in FIG. 7C. The air is then exhausted through the area between the housing member 12 and the printed wiring board 18 to atmosphere.

All of the parameters, namely, temperature, air flow, vacuum flow and time can be established prior to usage thereby ensuring successful operation. If modifications need be made, however, they can be done easily by adjusting the current to the electric heater elements or air-vacuum flow to obtain the desired combination.

Although a four sided heater assembly having four heating elements is disclosed for efficient melting of the solder on four sided leadless chip carriers, it is to be understood that the heater assembly can take any shape as can the wall of the bore in the housing member to correspond to the shape of the leadless chip carrier. If the leadless chip carrier is circular, the heater assembly can, for example, be circular and in this instance, the heater element may be wound in a circle with increasing density down the length thereof. These and many different embodiments of this invention may be made without departing from the scope and spirit thereof. Therefore, it is to be understood that the invention is not to be limited to the specific embodiment shown and described herein, except as defined in the appended claims.

What is claimed is:

1. A device for soldering semiconductor modules having contact pads on the bottom thereof to and desoldering them from leaded terminal surfaces on a printed wiring board, said device comprising:

(a) a housing member having a longitudinally extending bore therethrough defined by a wall, said bore having a first opening adjacent one end of said housing adapted to enclose said module while said module is on said leaded terminal surfaces, (b) an inner member slidable in said bore, (c) means for supplying air under pressure between said wall and said inner member, said inner member having a passageway connecting an intake port at one end of said inner member to a source of vacuum connected to an exhaust port at the other end of said inner member, and (d) means for heating said air under pressure as it passes between and contacts said wall and said inner member to thereby melt said leaded terminal surfaces to enable soldering or desoldering of said module when said first opening of said housing member is brought to a position adjacent said module.

2. A device as set forth in claim 1 wherein said housing member has a second opening communicating with said bore adjacent the other end of said housing and said inner member extends through said second opening, said device further comprising:
   (a) plate means attached to said inner member adjacent said port at the other end thereof, and
   (b) guide means extending between said housing member and said plate means.

3. A device as set forth in claim 2 further comprising resilient means on said guide means to bias said plate means away from said housing member.

4. A device as set forth in claim 1 wherein said means for supplying air under pressure is connected to at least one passageway opening at said wall for introducing said air between said wall and said inner member.

5. A device as set forth in claim 1 wherein said means for heating said air under pressure is at least one electrical resistance means secured to said inner member and extending longitudinally thereof to a point adjacent said port at said one end thereof.

6. A device as set forth in claim 5 wherein said electrical resistance means is so constructed that heat radiated thereby gradually decreases in amount from a maximum adjacent said intake port to a minimum adjacent said exhaust port.

7. A device as set forth in claim 1 wherein said inner member has an outer surface with at least one channel formed therein, and said means for heating said air under pressure is an electrical resistance means embedded in said channel.

8. A device for soldering semiconductor modules having contact pads on the bottom thereof and desoldering them from leaded terminal surfaces on a printed wiring board, said device comprising:
   (a) a housing member having a longitudinally exteding bore therethrough defined by a wall, said bore having a first opening adjacent one end of said housing adapted to enclose said module while said module is on sAid leaded terminal surfaces,
   (b) an inner member slidable in said bore, said housing having a second opening communicating with said bore adjacent the other end of said housing, said inner member extending through said second opening,
   (c) plate means attached to said inner member adjacent said port at the other end thereof,
   (d) guide means extending between said housing member and said plate means,
   (e) resilient means on said guide means to bias said plate means away from said housing member,
   (f) means for supplying air under pressure between said wall and said inner member, said inner member having a passageway connecting an intake port at one end of said inner member to a source of vacuum connected to an exhaust port at the other end of said inner member for drawing said air under pressure through said port, and
   (g) means for heating said air under pressure as it passes between said wall and said inner member to thereby melt said leaded terminal surfaces to enable soldering or desoldering of said module when said first opening of said housing member is brought to a position adjacent said module.

9. A device for soldering semiconductor modules having contact pads on the bottom thereof to and desoldering them from leaded terminal surfaces on a printed wiring board, said device comrising:
   (a) a housing member having a longitudinally extending bore therethrough defined by a wall, said bore having a first opening adjacent one end of said housing adapted to enclose said module while said module is on said leaded terminal surfaces,
   (b) an inner member slidable in said bore,
   (c) means for supplying air under pressure between said wall and said inner member, said inner member having a passageway connecting an intake port at one end of said inner member to a source of vacuum connected to an exhaust port at the other end of said inner member for drawing said air under pressure through said port, and
   (d) means for heating said air under pressure as it passes between said wall and said inner member to thereby melt said leaded terminal surfaces to enable soldering or desoldering of said module when said first opening of said housing member is brought to a position adjacent said module, said means for heating said air under pressure being at least one electrical resistance means secured to said inner member and extending longitudinally thereof to a point adjacent to said port at said one end thereof, said electrical resistance means being so constructed that heat radiated thereby gradually decreases in amount from a maximum adjacent said intake port to a minimum adjacent to said exhaust port.

* * * * *